United States Patent [19]
Omori

[11] Patent Number: 6,066,866
[45] Date of Patent: May 23, 2000

[54] SEMICONDUCTOR DEVICE WITH ALTERNATING GENERAL-PURPOSE FUNCTIONAL REGIONS AND SPECIFIC FUNCTIONAL REGIONS

[75] Inventor: Naoko Omori, Tokyo, Japan

[73] Assignee: Mitsubishi Denki Kabushiki Kaisha, Tokyo, Japan

[21] Appl. No.: 09/093,723

[22] Filed: Jun. 9, 1998

[30] Foreign Application Priority Data

Jan. 13, 1998 [JP] Japan .................................. 10-005194

[51] Int. Cl.⁷ .......................... H01L 27/10; H01L 29/76; H01L 29/94
[52] U.S. Cl. .......................... 257/202; 257/204; 257/206; 257/390
[58] Field of Search .................................. 257/202, 204, 257/206, 390

[56] References Cited

U.S. PATENT DOCUMENTS

| | | | |
|---|---|---|---|
| 4,161,662 | 7/1979 | Malcolm et al. | 257/204 |
| 4,750,027 | 6/1988 | Asami | 257/204 |
| 4,786,613 | 11/1988 | Gould et al. | 257/204 |
| 5,060,046 | 10/1991 | Shintani | 257/206 |
| 5,404,034 | 4/1995 | Yin | 257/204 |
| 5,663,662 | 9/1997 | Kurosawa | 326/41 |

FOREIGN PATENT DOCUMENTS 3-209847   9/1991   Japan .

*Primary Examiner*—Mahshid Saadat
*Assistant Examiner*—Jesse A. Fenty
*Attorney, Agent, or Firm*—Burns, Doane, Swecker & Mathis, LLP

[57] ABSTRACT

When constructing a number of transistors in transistor forming region (1) on a semiconductor substrate, a plurality of specific functional regions and a plurality of general-purpose functional regions are formed in the transistor forming region (1) in such a way that each of the plurality of specific functional regions alternates with each of the plurality of general-purpose functional regions. Each of the plurality of general-purpose functional regions is comprised of at least one general-purpose functional bank (4) including a row of P-channel field-effect transistors and a row of N-channel field-effect transistors. Each of the plurality of specific functional regions is comprised of at least one specific functional bank (5) including a row of functional blocks (6) each of which can perform a specific function.

5 Claims, 9 Drawing Sheets

SEMICONDUCTOR DEVICE WITH ALTERNATING GENERAL-PURPOSE FUNCTIONAL REGIONS AND SPECIFIC FUNCTIONAL REGIONS

BACKGROUND OF THE INVENTION

1. Field of the Invention

The present invention relates to a semiconductor device on which a plurality of transistors are formed, and a method of manufacturing semiconductor devices. More particularly, it relates to a method of manufacturing semiconductor devices which is suitable when implementing a desired electronic circuit on a semiconductor substrate through the use of automatic layout and wiring means.

2. Description of the Prior Art

When categorizing available semiconductor device manufacturing methods broadly, there are two manufacturing methods for constructing a desired electronic circuit by using a semiconductor substrate on which a plurality of transistors are formed, and by connecting between the plurality of transistors according to wiring information.

One of them is the cell-based manufacturing method in which the circuit designer is required to not only design a desired electronic circuit according to some parameters of the semiconductor substrate, but determine the layout of transistors included in the electronic circuit. The other one is the gate-array manufacturing method in which the circuit designer is required to design a desired electronic circuit according to the transistor characteristics of the semiconductor substrate on which a number of transistors having the same size are arranged in the form of a two-dimensional array. The former cell-based manufacturing method has an advantage that it can offer a high-performance electronic circuit because the circuit designer can design the sizes and locations of the plurality of transistors included in the desired electronic circuit freely. The latter gate-array manufacturing method has an advantage that the circuit designer can design a desired semiconductor device by only doing the circuit design because the circuit designer does not need to design the plurality of transistors formed on the semiconductor substrate, and therefore can determine the locations of the plurality of transistors through the use of automatic layout and wiring means.

Another manufacturing method, which is called embedded-cell-array or ECA manufacturing method, capable of providing the circuit designer with general-purpose functional blocks such as macro cells including memories, A/D converters, and so on, is available now. The ECA manufacturing method is an improved version of the gate-array manufacturing method. Like the gate-array manufacturing method, the ECA manufacturing method offers an advantage that the circuit designer can design a desired semiconductor device through the use of automatic layout and wiring means. In addition, the ECA manufacturing method has another advantage that the circuit designer does not need to design functional blocks required by the semiconductor device because the circuit designer only selects a desired functional block from all functional blocks provided by the method and uses it as a part of the semiconductor device, resulting in a further reduction in the time required for the circuit design.

Figure 10:
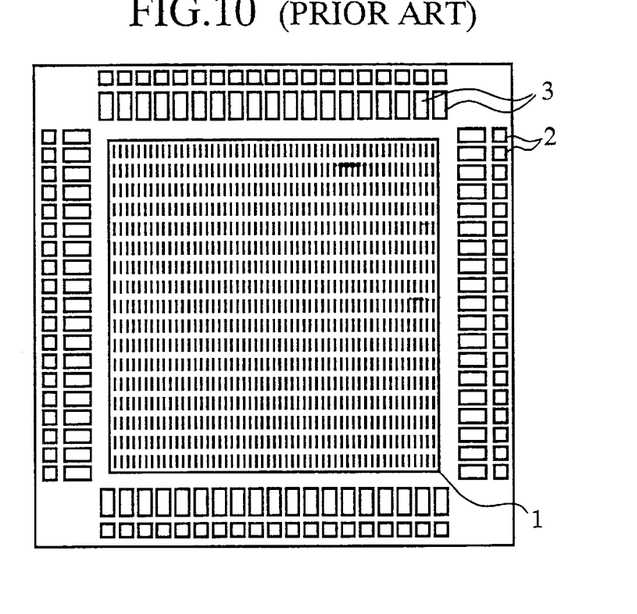
FIG. 10 is a plan view showing the layout of an example of a semiconductor device which is manufactured by using a prior art gate-array manufacturing method.

Referring now to FIG. 10, there is illustrated a plan view showing the layout of a semiconductor device which is manufactured by using the gate-array manufacturing method, as disclosed in "1995 Mitsubishi Semiconductor CMOS Gate Array 0.8 μm Data Book". In the figure, reference numeral 1 denotes a transistor forming region in which a plurality of field-effect transistors are formed in the form of a two-dimensional array, 2 denotes a pointing pad for connecting an electronic circuit formed on the semiconductor substrate with an external pin, and 3 denotes an external input/output buffer located between an input/output transistor disposed within the transistor forming region 1 and a corresponding pointing pad 2, for interfacing between them.

Figure 11:
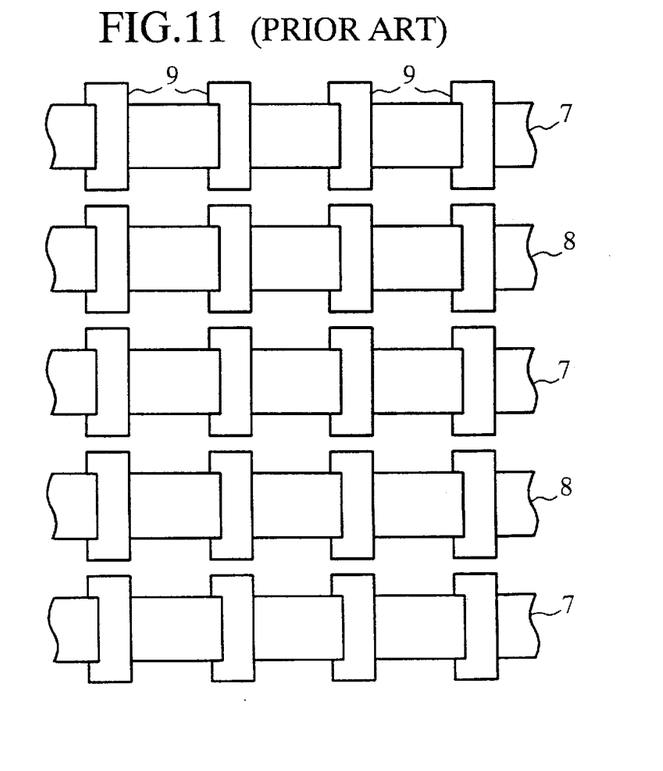
FIG. 11 is a plan view showing an enlarged part of an example of the transistor forming region of the semiconductor device shown in FIG. 10.

Referring next to FIG. 11, there is illustrated a plan view showing an enlarged part of an example of the transistor forming region 1. In the example, both a plurality of P-channel field-effect transistors and a plurality of N-channel field-effect transistors are formed in the transistor forming region 1. In FIG. 1, reference numeral 7 denotes a P-channel diffusion area extending longitudinally in parallel with one side of the transistor forming region 1, 8 denotes an N-channel diffusion area extending longitudinally in parallel with a plurality of P-channel diffusion areas 7, 9 denotes a gate electrode. A plurality of gate electrodes 9 are arranged at predetermined intervals on each P-channel diffusion area 7 and on each N-channel diffusion area 8.

Figure 12:
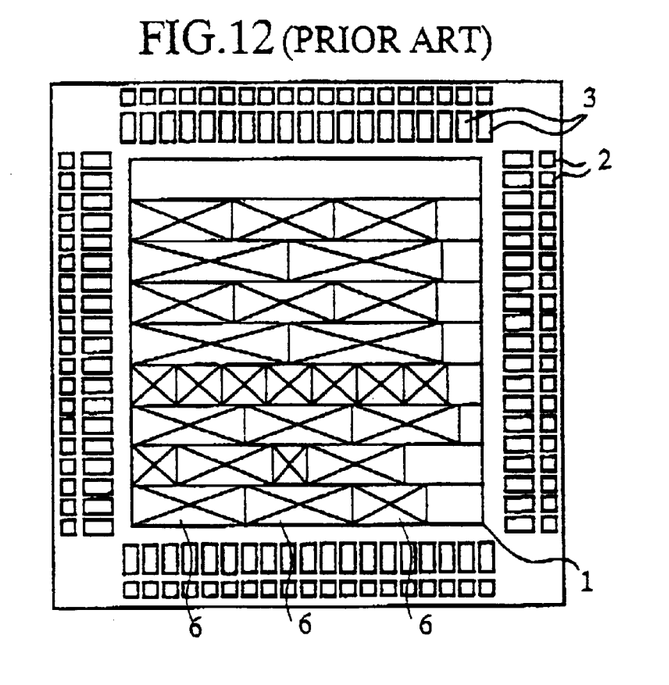
FIG. 12 is a plan view showing the layout of an example of an electronic circuit which is formed in the transistor forming region through the use of automatic layout and wiring means.

Referring next to FIG. 12, there is illustrated a plan view showing an example of the circuit layout of an electronic circuit which is formed in the transistor forming region 1 through the use of automatic layout and wiring means. In the figure, reference numeral 6 denotes a functional block, such as a logic circuit or a flip-flop, which constructs a part of the electronic circuit. Typically, through the use of automatic layout and wiring means, a gate-array semiconductor device can be configured so that a plurality of functional blocks 6 are arranged in each bank comprised of one pair of P-channel and N-channel diffusion areas 7 and 8 such that they are left-aligned, as shown in FIG. 12. Alternatively, a plurality of functional blocks 6 can be arranged in each bank comprised of one pair of P-channel and N-channel diffusion areas 7 and 8 so that they are right-aligned or aligned in another specified form.

Figure 13:
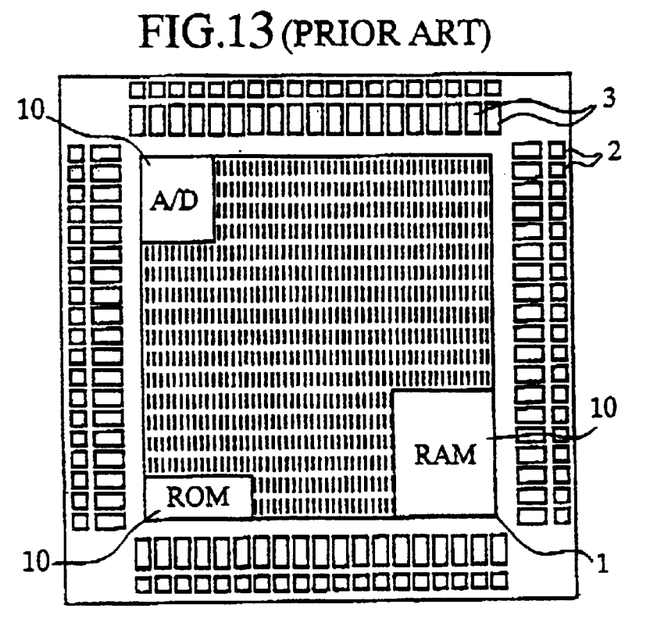
FIG. 13 is a plan view showing the layout of a semiconductor device which is manufactured by using a prior art ECA manufacturing method.

Referring next to FIG. 13, there is illustrated a plan view showing the layout of a semiconductor device which is manufactured by using the ECA manufacturing method, as disclosed in "1995 Mitsubishi Semiconductor Embedded-Cell-Array/Cell-based IC Data Book". In the figure, reference numeral 10 denotes a general-purpose functional block such as a memory or an A/D converter which can be provided for the circuit designer. By using the ECA manufacturing method, a number of functional blocks are arranged in the transistor forming region 1 except a plurality of general-purpose functional blocks 10, so that a desired electronic circuit is constructed in the transistor forming region 1, like in the case of using the gate-array manufacturing method mentioned above.

While either of the prior art gate-array manufacturing method and the prior art ECA manufacturing method has advantages that the burden of design work the circuit has to do can be reduced, and the manufacturing time required to complete manufacturing one semiconductor device can be reduced, compared with the prior art cell-based manufacturing method, semiconductor devices manufactured by using either one of those prior art methods have disadvantages that a further improvement in the degree of integration cannot be expected and the power consumption in semiconductor devices manufactured is relatively large, compared with semiconductor devices manufactured by using the prior art cell-based semiconductor device manufacturing method.

To be more specific, using either the prior art gate-array manufacturing method or the prior art ECA manufacturing method, a number of transistors are formed in the transistor forming region so that all the transistors have a size which is large enough for all the transistors to operate as output buffers, because information on the uses of the plurality of transistors is unavailable. The size of transistors employed as the internal circuit of each functional block thus becomes larger needlessly. As a result, the size of each functional block is larger than that in the case of constructing a functional block having the same function by using the prior art cell-based manufacturing. This results in longer conductors installed in each functional block and hence a larger amount of capacitance that exists in each of the conductors.

In either one of the prior art gate-array manufacturing method and the prior art ECA manufacturing method, since a plurality of functional blocks are arranged on a semiconductor substrate through the use of automatic layout and wiring, some of all transistors formed in each bank are not used and therefore the utilization factor of transistors is reduced.

For the reasons mentioned above, the problems with both the prior art gate-array manufacturing method and the prior art ECA manufacturing method are that a further improvement in the degree of integration cannot be expected and the power consumption in semiconductor devices manufactured is relatively large, compared with the prior art cell-based semiconductor device manufacturing method.

SUMMARY OF THE INVENTION

The present invention is made to overcome the above problems. It is therefore an object of the present invention to provide a semiconductor device manufacturing method capable of arranging a plurality of functional blocks on a semiconductor substrate through the use of automatic layout and wiring means, and manufacturing a semiconductor device which is ever more highly integrated, consumes less power, and needs a shorter length of manufacturing time, compared with semiconductor devices manufactured by the prior art gate-array manufacturing method or the prior art ECA manufacturing method, and such a semiconductor device.

In accordance with one aspect of the present invention, there is provided a method of manufacturing a semiconductor device, comprising the steps of: when constructing a number of transistors on a semiconductor substrate, forming a plurality of specific functional regions each provided with a plurality of transistors and intended for implementing one or more specific functional blocks each of which can perform a specific function of a desired electronic circuit, and a plurality of general-purpose functional regions each provided with a plurality of transistors in such a way that each of the plurality of specific functional regions alternates with each of the plurality of general-purpose functional regions; and establishing necessary electric connections between the plurality of transistors in each of the plurality of specific functional regions, between the plurality of transistors in each of the plurality of general-purpose functional regions, and between the plurality of specific functional regions and the plurality of general-purpose functional regions.

In accordance with another aspect of the present invention, there is provided a semiconductor device comprising a semiconductor substrate on which a plurality of specific functional regions each provided with a plurality of transistors and intended for implementing one or more specific functional blocks each of which can perform a specific function of a desired electronic circuit, and a plurality of general-purpose functional regions each provided with a plurality of transistors are formed in such a way that each of the plurality of specific functional regions alternates with each of the plurality of general-purpose functional regions.

Preferably, the plurality of general-purpose functional regions are formed so that each of the plurality of general-purpose functional regions is comprised of at least one general-purpose functional bank including a row of P-channel field-effect transistors and a row of N-channel field-effect transistors. In addition, the plurality of specific functional regions are formed so that each of the plurality of specific functional regions is comprised of at least one specific functional bank including a row of functional blocks each of which can perform a specific function.

In accordance with a preferred embodiment of the present invention, in each general-purpose functional bank, a direction in which the rows of P-channel and N-channel field-effect transistors are aligned is parallel to a direction in which the length of the gate electrodes of the P-channel and N-channel field-effect transistors is oriented.

In accordance with another preferred embodiment of the present invention, in each general-purpose functional bank, a direction in which the rows of P-channel and N-channel field-effect transistors are arranged is orthogonal to a direction in which the length of the gate electrodes of the P-channel and N-channel field-effect transistors is oriented.

Preferably, each of the plurality of functional blocks is constructed so as to serve as a flip-flop. The flip-flop can be a set-reset scan flip-flop.

In accordance with another preferred embodiment of the present invention, the plurality of functional blocks are constructed so as to perform an identical function. Besides at least one common signal is applied to the plurality of functional blocks.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
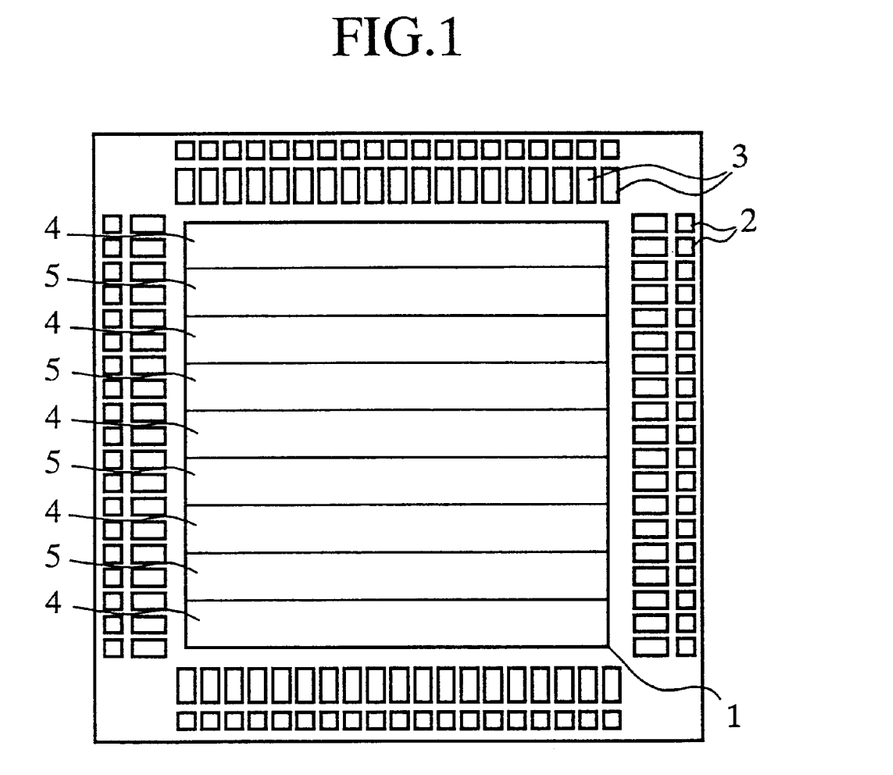
FIG. 1 is a plan view briefly showing the layout of a semiconductor device which is manufactured by using a method of manufacturing an embedded-cell-array or ECA semiconductor device, according to a first embodiment of the present invention.

Referring next to FIG. 1, there is illustrated a plan view briefly showing the layout of a semiconductor device which is manufactured by using a method of manufacturing an embedded-cell-array or ECA semiconductor device, according to a first embodiment of the present invention. In the figure, reference numeral 1 denotes a transistor forming region in which a plurality of field-effect transistors are formed in the form of a two-dimensional array on a semiconductor substrate, 2 denotes a pointing pad for connecting an electronic circuit formed on the semiconductor substrate with a corresponding pin (not shown), and 3 denotes an input/output buffer located between an input/output transistor disposed within the transistor forming region 1 and a corresponding pointing pad 2, for interfacing between them. Furthermore, reference numeral 5 denotes a specific functional bank including a plurality of transistors, and 4 denotes a general-purpose functional bank including a plurality of transistors. Each specific functional bank 5 is intended to implement a plurality of specific functional blocks each of which performs a specific function of the electronic circuit. As shown in FIG. 1, each of the plurality of specific functional banks 5 alternates with each of the plurality of general-purpose functional banks 4 in the transistor forming region 1. In the first embodiment, one specific functional region is constructed of one specific functional bank 5, and one general-purpose functional region is constructed of one general-purpose functional bank 4.

Figure 2:
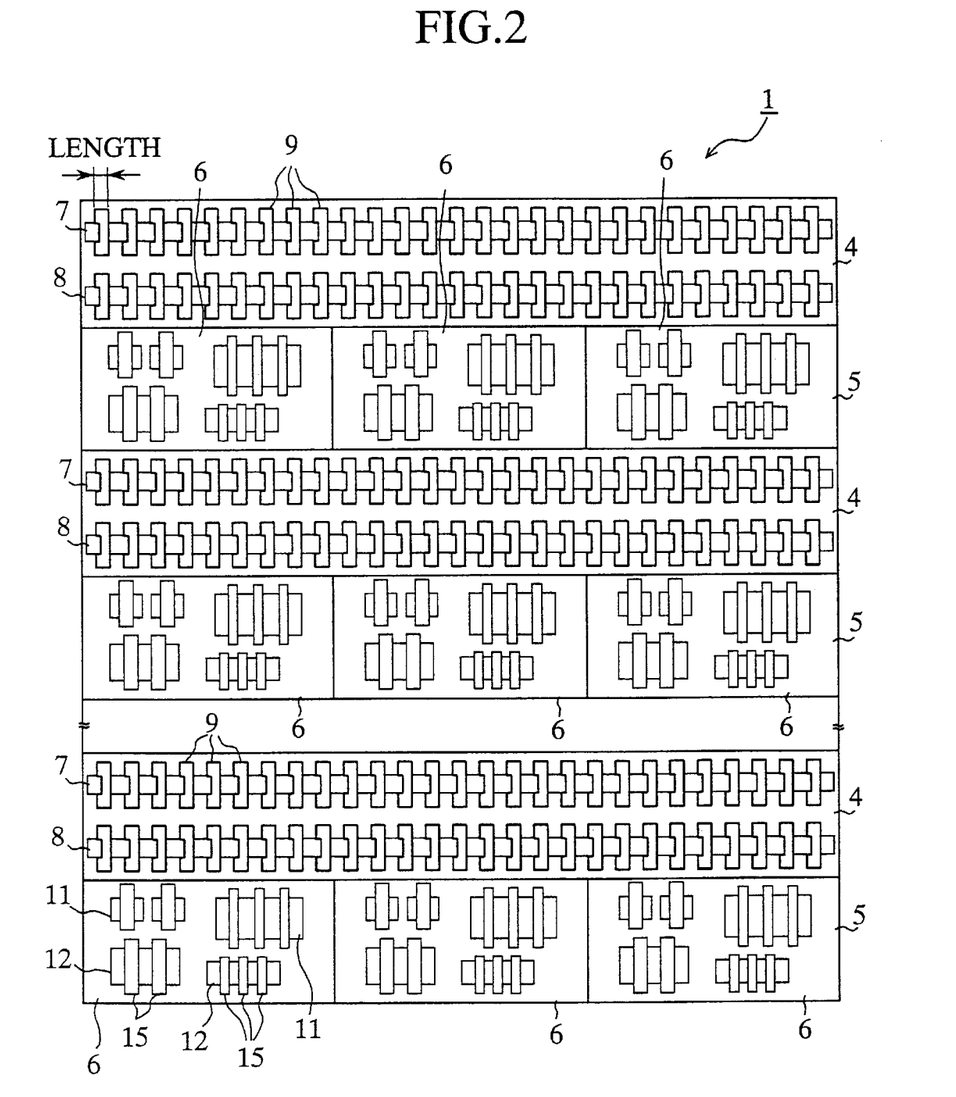
FIG. 2 is a plan view showing the layout of transistors formed in the transistor forming region of the semiconductor substrate shown in FIG. 1.

Referring next to FIG. 2, there is illustrated a layout view showing an example of the transistor forming region 1 according to the first embodiment of the present invention. In the figure, reference numeral 7 denotes a P-channel diffusion area extending longitudinally in parallel with one side of the transistor forming region 1, 8 denotes an N-channel diffusion area extending longitudinally in parallel with each P-channel diffusion area 7, and 9 denotes a gate electrode. A plurality of gate electrodes 9 are arranged at predetermined intervals on each P-channel diffusion area 7 and on each N-channel diffusion area 8. Each general-purpose functional bank 4 is thus provided with both a bank or row of P-channel field-effect transistors and a bank or row of N-channel field-effect transistors.

As shown in FIG. 2, in each general-purpose functional bank 4, a row of P-channel field-effect transistors is aligned so that the direction in which they are arranged is parallel to the direction in which the length of their gate electrodes is oriented. In other words, the plurality of P-channel field-effect transistors each comprised of a part of one P-channel diffusion area 7 and one gate electrode 9 are arranged longitudinally in the direction parallel to the direction in which the length of their gate electrodes 9 is oriented. Similarly, the plurality of N-channel field-effect transistors are also arranged longitudinally in the direction parallel to the direction in which the length of their gate electrodes 9 is oriented.

Reference numeral 11 denotes a P-channel diffusion area, 12 denotes an N-channel diffusion area arranged in parallel with at least one P-channel diffusion area 11, and 15 denotes a gate electrode. One or more gate electrodes 15 are arranged at predetermined intervals on each P-channel diffusion area 11 and on each N-channel diffusion area 12. Reference numeral 6 denotes a functional block comprised of such components 11, 12, and 15, which serves as a flip-flop. Each specific functional bank 5 is comprised of a plurality of functional blocks 6. Each combination of either one P-channel diffusion area 11 or one N-channel diffusion area 12, and at least one gate electrode 15 which can serve as a transistor can be configured so as to have a minimum size required for implementing a flip-flop within one functional block. Therefore, the area occupied by each functional block 6, which serves as a flip-flop, can be reduced compared with a flip-flop with the same function which can be formed in one general-purpose bank 4.

Next, a description will be made as to further processes of constructing a desired electronic circuit on a semiconductor substrate formed as shown in FIGS. 1 and 2. A plurality of functional blocks each of which constructs a part of a desired electronic circuit is arranged in each general-purpose function bank 4 and a plurality of functional blocks each of which serves as a flip-flop are arranged in each specific functional bank 5 by means of an automatic layout and wiring device. A plurality of transistors to be included in the desired electronic circuit are then laid out in each functional block, and the wiring in each functional block is determined.

Figure 3:
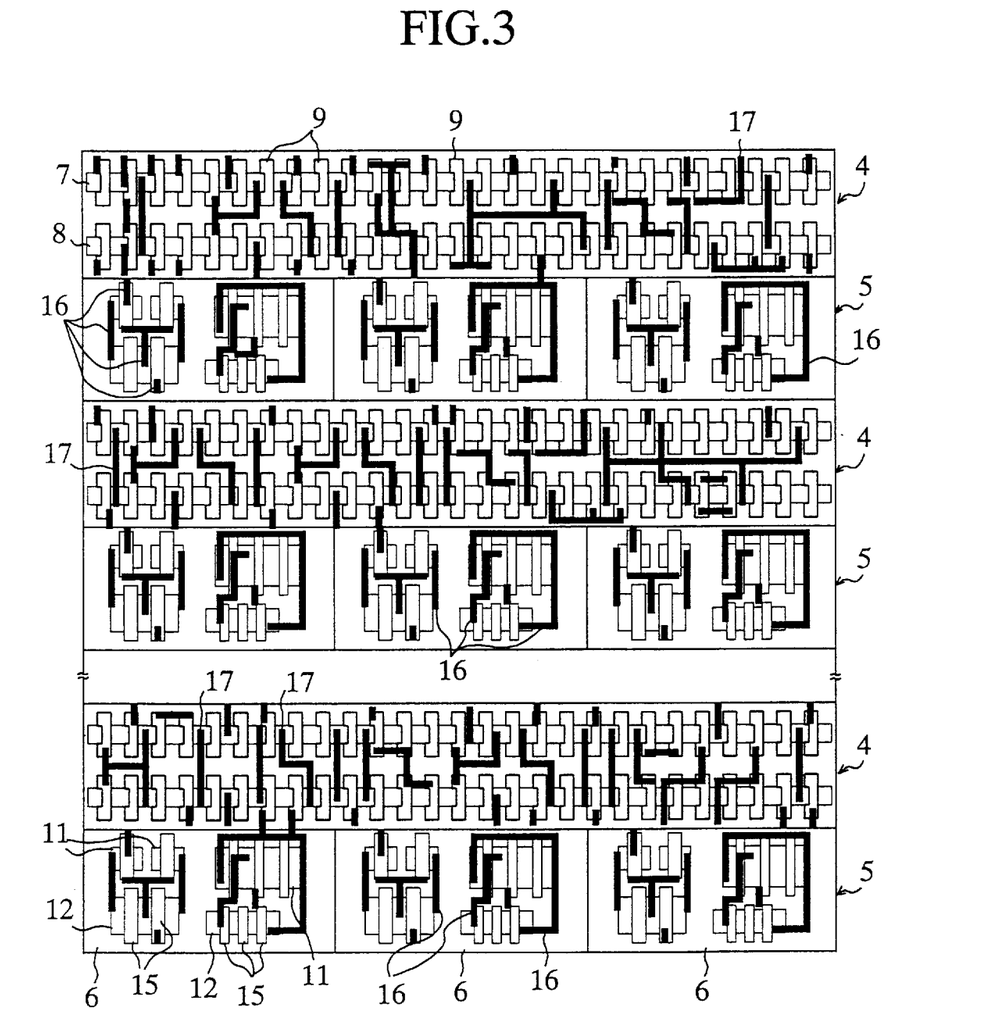
FIG. 3 is a wiring diagram showing the semiconductor device according to the first embodiment of the present invention, in which a plurality of functional blocks each of which constructs a part of a desired electronic circuit are arranged on the semiconductor substrate and the necessary wiring is installed in each functional block, through the use of automatic layout and wiring means.

Referring next to FIG. 3, there is illustrated a wiring diagram showing a semiconductor device in which a plurality of functional blocks each of which constructs a part of a desired electronic circuit are arranged on a semiconductor substrate and the necessary wiring is installed in each functional block, according to such the automatic layout and wiring mentioned above. In the figure, reference numeral 16 denotes a conductor required for forming a specific functional block 6 disposed in each specific functional bank 5, and 17 denotes a conductor required for forming each functional block of any type disposed in each general-purpose functional bank 4. The other structure is the same as that shown in FIG. 2, and therefore the description about the other structure is omitted hereafter.

Next, the layout of all wiring between a plurality of functional blocks arranged in the transistor forming region 1 is determined according to the circuit information about the desired electronic circuit. The wiring between the plurality of functional blocks is then installed. The semiconductor device according to the present invention is thus completed.

Figure 4:
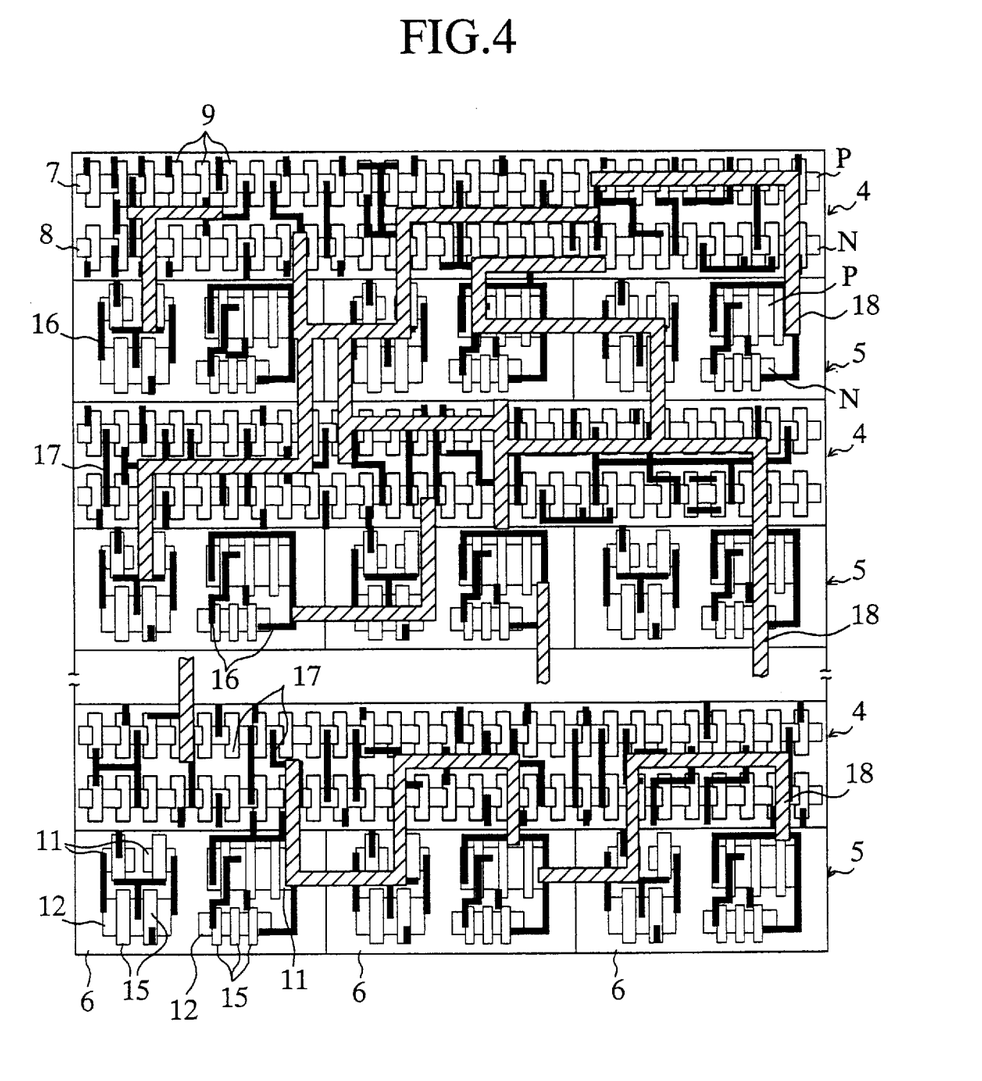
FIG. 4 is a wiring diagram showing the semiconductor device according to the first embodiment of the present invention, in which the necessary wiring between the plurality of functional blocks is further installed through the use of automatic layout and wiring means.

Referring next to FIG. 4, there is illustrated a wiring diagram showing the semiconductor device in which the necessary wiring between the plurality of functional blocks is installed through the use of the automatic layout and wiring device. In the figure, reference numeral 18 denotes a conductor for connecting one functional block with one or more functional blocks. The other structure is the same as that shown in FIG. 3, and therefore the description about the other structure is omitted hereafter.

As previously mentioned, according to the first embodiment of the present invention, a plurality of specific functional banks 5 each comprised of a plurality of transistors and intended to implement a plurality of flip-flops and a plurality of general-purpose functional banks 4 each comprised of a plurality of transistors are formed on a semiconductor substrate so that each of the plurality of specific functional banks 5 alternates with each of the plurality of general-purpose functional banks 4. Connections are then made between a plurality of transistors in each of functional blocks disposed within each of the plurality of general-purpose functional banks 4 and the plurality of specific functional banks 5 and connections are also made between a plurality of functional blocks, according to the wiring information. Accordingly, while the first embodiment benefits from the effect of the automatic layout and wiring, it can offer an advantage of reducing the size of transistors which construct one flip-flop formed on each specific functional bank 5 to a minimum size required for implementing one flip-flop.

Since the size of transistors which serve as an internal circuit in one flip-flop formed on each specific functional bank 5 can be reduced to a minimum required for implementing one flip-flop, the area occupied by one flip-flop or functional block 6 and the amount of current flowing through one flip-flop can be reduced to the same levels as those of a flip-flop provided by the prior art cell-based manufacturing method, resulting in a low power, highly-integrated semiconductor device.

Furthermore, since each of the plurality of general-purpose functional banks 4 alternates with each of the plurality of specific functional banks 5, the lengths of conductors between each functional block 6 and other functional blocks located in the vicinity of each functional block 6 can be reduced to the same levels as those of conductors routed by using the prior art cell-based manufacturing method. The capacitance of wiring between gates can be reduced to the same level as in the prior art. In addition, the size of the output transistor in each of functional blocks including flip-flop circuits can be reduced to the same size as of transistors included in a simple gate-array semiconductor device manufactured by using the prior art manufacturing method. Accordingly, the first embodiment of the present invention can press the aforementioned advantages of high-integration and lower power consumption to the limit.

Furthermore, according to the first embodiment of the present invention, since a plurality of specific functional blocks each of which implements a flip-flop are arranged optimally in each of the plurality of specific functional banks 5, there is no possibility that extra transistors are formed in each of the plurality of specific functional banks 5 when performing the automatic layout and wiring, unlike in the case of constructing a plurality of flip-flops in each of the plurality of general-purpose banks 4. Accordingly, the utilization factor of transistors can be increased.

In addition, according to the first embodiment of the present invention, although both P-channel and N-channel diffusion areas 7 and 8 are formed in common for a plurality of transistors in each general-purpose functional bank 4 and a so-called gate isolation transistor placement method in which the plurality of transistors are isolated from each other by a plurality of gate electrodes 9 is adopted, a plurality of power supply lines are installed optimally because the direction in which the plurality of P-channel and N-channel field-effect transistors are aligned is parallel to the direction in which the length of their gate electrodes 9 is oriented. When forming an output buffer by using a plurality of transistors in each general-purpose functional bank 4, connections can be established between the plurality of adjacent transistors in such a way that the wiring layout is linear. The wiring between the plurality of adjacent transistors is thus installed efficiently. Accordingly, the aforementioned advantages of high-integration and low power consumption can be further improved.

Furthermore, according to the first embodiment of the present invention, since each specific functional bank 5 is comprised of a plurality of transistors intended to implement a plurality of functional blocks 6 and alternates with each general-purpose functional bank 4, the first embodiment can offer an advantage of being able to construct a highly-integrated, very-low power synchronization control circuit, which is widely used, in the transistor forming region 1.

Second Embodiment

Figure 5:
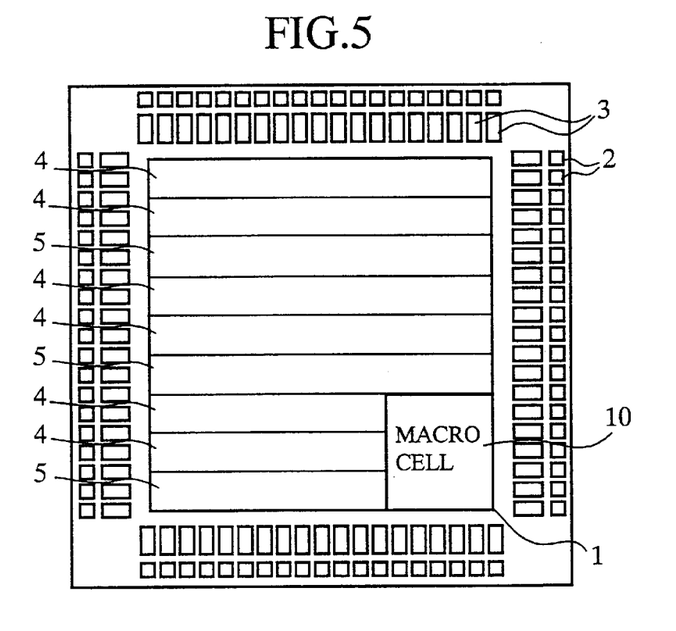
FIG. 5 is a plan view briefly showing the layout of a semiconductor device which is manufactured by using a method of manufacturing an embedded-cell-array or ECA semiconductor device, according to a second embodiment of the present invention.

Referring next to FIG. 5, there is illustrated a plan view briefly showing the layout of a semiconductor device which is manufactured by using a method of manufacturing an embedded-cell-array or ECA semiconductor device, according to a second embodiment of the present invention. In the figure, reference numeral 10 denotes a macro cell, such as a memory or an A/D converter, formed in a transistor forming region 1. One general-purpose functional region consists of two general-purpose functional banks 4. One specific functional region consists of one specific functional bank 5. Each general-purpose functional region alternates with each specific functional region. In other words, each general-purpose functional region comprised of two general-purpose functional banks 4 alternates with each specific functional bank 5. The other structure of the semiconductor device is the same as that of the first embodiment as shown in FIG. 1, and therefore the description about the other structure is omitted hereafter.

The second embodiment of the present invention thus offers an advantage of making it possible for the circuit designer to provide a desired semiconductor device by only placing at least one macro cell 10, such as a memory or an A/D converter, which has been selected by the circuit designer in the transistor forming region 1 and then establishing electric connections between the macro cell and a plurality of functional blocks and between the plurality of functional blocks by means of the automatic layout and wiring device, as well as the same advantages as provided by the first embodiment. The second embodiment provides another advantage of reducing the time required to design the desired electronic device because the circuit designer is not required to design the macro cell 10, such as a memory or an A/D converter, which is incorporated into the semiconductor device.

Furthermore, since each general-purpose functional region consists of two general-purpose functional banks 4, the capability of each of a plurality of functional blocks formed in each general-purpose functional region can be improved.

In a variant of the embodiment, one general-purpose functional region can consist of three or more general-purpose functional banks 4, and one specific functional region can consist of two or more specific functional banks 5.

Third Embodiment

Figure 6:
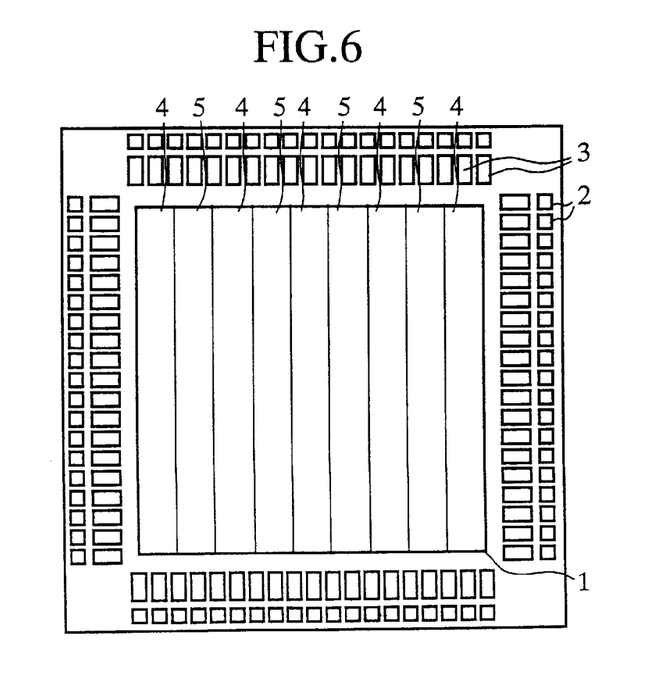
FIG. 6 is a plan view briefly showing the layout of a semiconductor device which is manufactured by using a method of manufacturing an embedded-cell-array or ECA semiconductor device, according to a third embodiment of the present invention.
Figure 7:
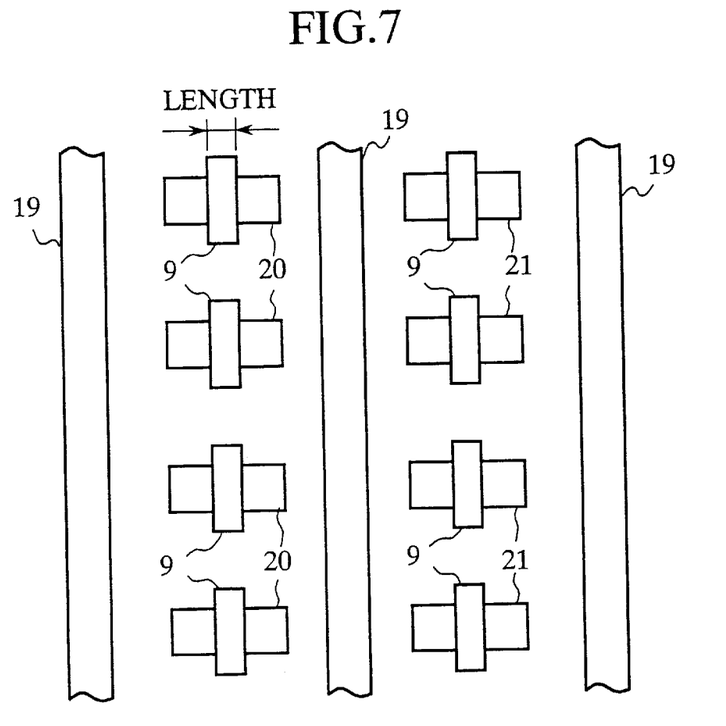
FIG. 7 is a plan view showing an enlarged part of one general-purpose functional bank of the semiconductor device shown in FIG. 6.

Referring next to FIG. 6, there is illustrated a plan view briefly showing the layout of a semiconductor device which is manufactured by using a method of manufacturing an embedded-cell-array or ECA semiconductor device, according to a third embodiment of the present invention. Furthermore, FIG. 7 shows a plan view showing an enlarged part of each general-purpose functional bank 4 formed in the transistor forming region 1 of the semiconductor device shown in FIG. 6. In the figure, reference numeral 20 denotes a P-channel diffusion area which is formed for each P-channel field-effect transistor, 21 denotes an N-channel diffusion area which is formed for each N-channel field-effect transistor, and 19 denotes a power supply extending longitudinally along each general-purpose functional bank 4. As shown in FIG. 7, in each general-purpose functional bank 4, a row of P-channel field-effect transistors is aligned so that the direction in which they are arranged is orthogonal to the direction in which the length of their gate electrodes is oriented. In other words, the plurality of P-channel field-effect transistors each comprised of one P-channel diffusion area 20 and one gate electrode 9 are arranged side by side (or transversely) in the direction orthogonal to the direction in which the length of their gate electrodes 9 is oriented. Similarly, the plurality of N-channel field-effect transistors are also arranged side by side in the direction orthogonal to the direction in which the length of their gate electrodes 9 is oriented. The other structure of the semiconductor device of the third embodiment is the same as that of the semiconductor device of the first embodiment, and therefore the description about the other structure will be omitted hereafter.

As previously mentioned, according to the third embodiment, since both the plurality of P-channel field transistors and the plurality of N-channel field transistors are arranged transversely in each general-purpose bank 4 so that the direction in which the plurality of P-channel and N-channel field-effect transistors are aligned is orthogonal to the direction in which the length of their gate electrodes 9 is oriented, a plurality of power supply lines can be installed in the direction orthogonal to the direction in which the length of the plurality of gate electrodes are oriented, i.e., in parallel with the direction in which the plurality of P-channel and N-channel field-effect transistors are aligned. The third embodiment also offers the same advantages as provided by the first embodiment.

Fourth Embodiment

Figure 8:
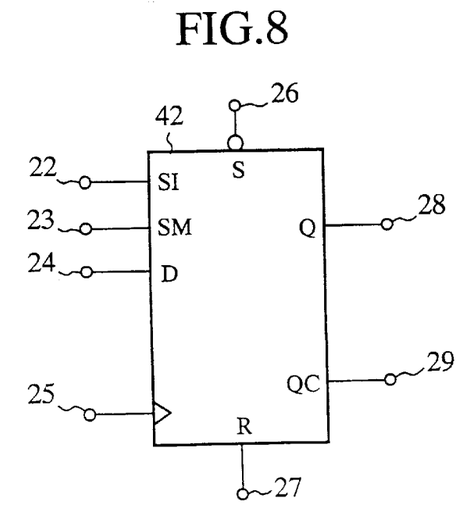
FIG. 8 is a block diagram of a set-reset scan flip-flop which is formed on a specific functional bank of a semiconductor device which is manufactured by using a method of manufacturing an embedded-cell-array or ECA semiconductor device, according to a fourth embodiment of the present invention.

Referring next to FIG. 8, there is illustrated a block diagram of a set-reset (or reset-set) scan flip-flop which can be formed on a specific functional bank in a transistor forming region of a semiconductor device according to a fourth embodiment of the present invention. In the figure, reference numeral 42 denotes a set-reset scan flip-flop, 23 denotes a mode setting terminal to which a control signal for switching the set-reset scan flip-flop between scan mode and normal operation mode is applied, 24 denotes a first data input terminal to which data effective in normal operation mode is applied, 22 denotes a second data input terminal to which data effective in scan mode is applied, and 25 denotes a clock input terminal to which a clock signal is applied. In response to the clock signal, the set-reset scan flip-flop 42 latches data applied to either the first data input terminal 24 or the second data input terminal 22 according to whether the set-reset scan flip-flop 42 is put into scan mode or normal operation mode. Furthermore, reference numeral 28 denotes a Q output terminal through which a digital signal having the same level as the data latched by the set-reset scan flip-flop is furnished, 29 denotes a QC output terminal through which the logical complement of the output from the Q output terminal 28 is furnished, 26 denotes a set input terminal which can accept a set signal for causing the scan flip-flop to furnish a signal at a high logic level by way of the Q output terminal 28 regardless of which levels the data input terminals have, and 27 denotes a reset input terminal which can accept a reset signal for causing the scan flip-flop to furnish a signal at a low logic level by way of the Q output terminal 28 regardless of which levels the data input terminals have.

When establishing electric connections between only the first data input terminal 24 and clock input terminal 25 and other components, the scan flip-flop serves as a D flip-flop. When further establishing an electric connection between the set input terminal 26 and another component, the scan flip-flop serves as a set D flip-flop. When further establishing an electric connection between the reset input terminal 27 and another component, the scan flip-flop serves as a set-reset or reset-set D flip-flop. When further establishing electric connections between the mode setting terminal 23 and second data input terminal 22 and other components, the scan flip-flop serves as a set-reset scan flip-flop. In other words, the scan flip-flop can serve as any one of eight varieties of flip-flops, according to whether the set signal is applied to its set terminal 26, whether the reset signal is applied to its reset terminal 27, and whether the mode setting signal is applied to its mode setting terminal 23.

In accordance with the fourth embodiment, at least one functional block which can serve as a set-reset scan flip-flop can be implemented in each specific functional bank 5 on the semiconductor substrate. Any one of the eight varieties of flip-flops can be implemented in each specific functional bank 5 by establishing necessary electric connections between transistors formed in each specific functional bank 5. In other words, all flip-flops required by a common synchronization circuit can be formed in one or more specific functional banks 5. Thus the fourth embodiment offers an advantage of providing ever more highly-integrated semiconductor devices.

Fifth Embodiment

Figure 9:
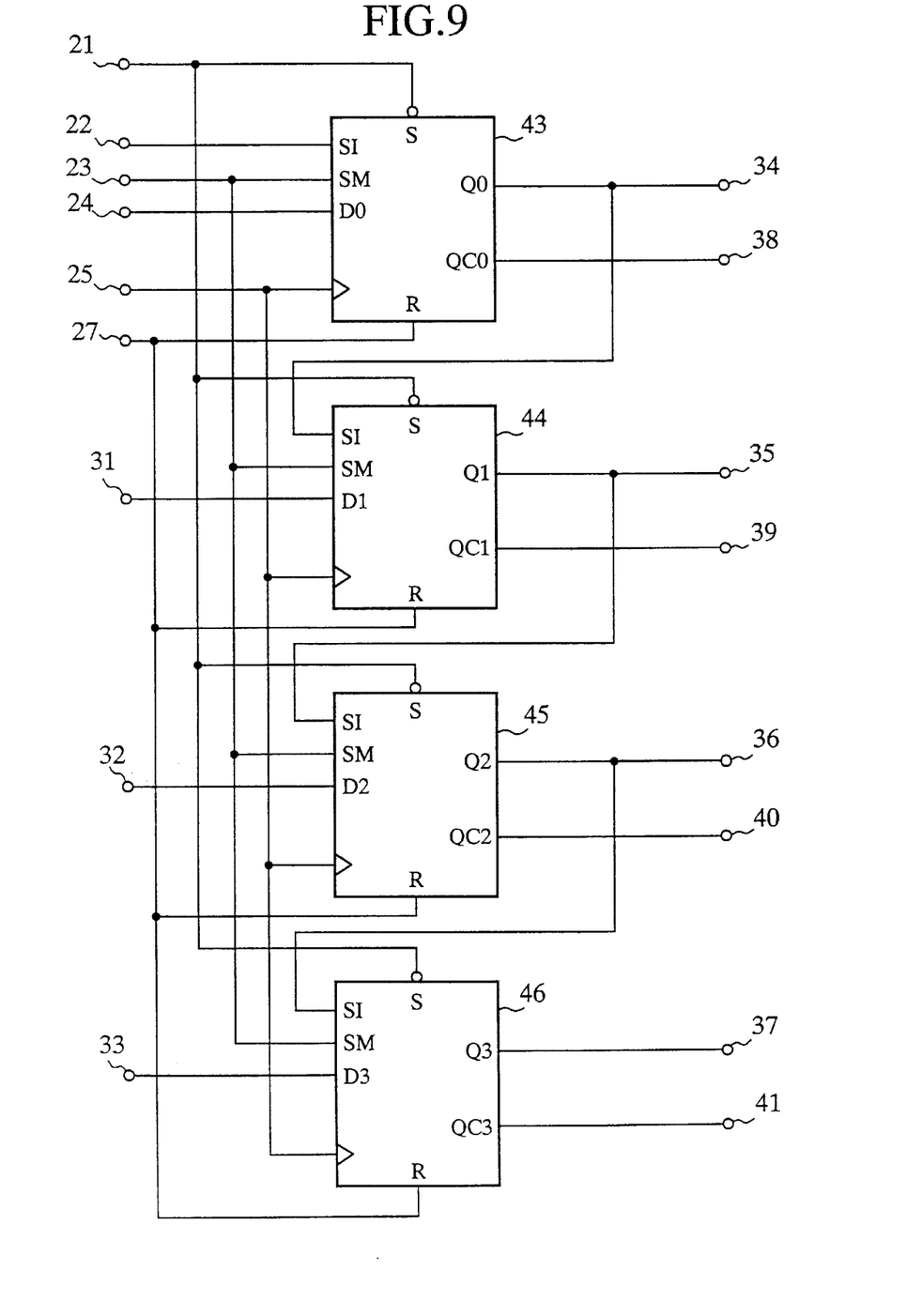
FIG. 9 is a block diagram of a functional block which is formed on a specific functional bank of a semiconductor device which is manufactured by using a method of manufacturing an embedded-cell-array or ECA semiconductor device, according to a fifth embodiment of the present invention.

Referring next to FIG. 9, there is illustrated a block diagram of a plurality of functional blocks which can be formed on a specific functional bank in a transistor forming region of a semiconductor device according to a fifth embodiment of the present invention. In the figure, reference numerals 43 through 46 denote set-reset scan flip-flops, 30 through 33 each denotes a data input terminal to which data effective in normal operation mode is applied to a corresponding one of the plurality of flip-flops 43 through 46, 34 through 37 each denotes a Q output terminal through which a digital signal having the same level as the data latched by a corresponding one of the plurality of flip-flops 43 through 46 is furnished, and 38 through 41 each denotes a QC output terminal through which the logical complement of the output from the Q output terminal of a corresponding one of the plurality of flip-flops 43 through 46 is furnished. The other structure of the semiconductor device of the fifth embodiment is the same as that of the semiconductor device of the fourth embodiment, and therefore the description about the other structure of the semiconductor device of the fifth embodiment will be omitted hereafter.

In accordance with the fifth embodiment, a plurality of functional blocks each of which can serve as a set-reset scan flip-flop can be implemented in each specific functional bank 5 on the semiconductor substrate. A clock signal, a mode setting signal, a set signal, and a reset signal can be applied in common to the plurality of functional blocks, as shown in FIG. 9. Accordingly, the lower limit of the size of each specific functional block which can serve as a set-reset scan flip-flop is not restricted by the minimum size of transistors included in each specific functional block, which depends on the type of the semiconductor substrate, unlike a conventional case where the input transistors of each functional block are formed so that the size of the input transistors is reduced to a minimum. Thus the fifth embodiment offers an advantage of reducing the area occupied by the whole of each specific functional bank 5.

As previously explained, each specific functional bank 5 includes, but not limited to, the same type of functional blocks 6 each of which serves as a flip-flop, in either one of the first through fifth embodiments of the present invention. Instead, each specific functional bank 5 can include various types of functional blocks. It is needless to say that the variant can offer the same advantages of high-integration and low power consumption as provided by the above-mentioned embodiments.

Many widely different embodiments of the present invention may be constructed without departing from the spirit and scope of the present invention. It should be understood that the present invention is not limited to the specific embodiment described in the specification, except as defined in the appended claims.

What is claimed is:

1. A semiconductor device comprising:
   a semiconductor substrate on which
      a plurality of specific functional regions, wherein each of said plurality of specific functional regions is comprised of at least one specific functional bank including a row of functional blocks which are each provided with a plurality of first transistors and second transistors of a size different than said first transistors, and
      a plurality of general-purpose functional regions, wherein each of said plurality of general-purpose functional regions is comprised of at least one general-purpose functional bank provided with a plurality of third transistors including a row of P-channel field-effect transistors and a row of N-channel field-effect transistors,
   are formed in such a way that each of said plurality of specific functional regions alternates with each of said plurality of general-purpose functional regions,
   wherein said first transistors are smaller in size than said third transistors.

2. The semiconductor device according to claim 1, wherein in each general-purpose functional bank, a direction in which said rows of P-channel and N-channel field-effect transistors are aligned is parallel to a direction in which the length of the gate electrodes of the P-channel and N-channel field-effect transistors is oriented.

3. The semiconductor device according to claim 1, wherein in each general-purpose functional bank, a direction in which said rows of P-channel and N-channel field-effect transistors are arranged is orthogonal to a direction in which the length of the gate electrodes of the P-channel and N-channel field-effect transistors is oriented.

4. The semiconductor device according to claim 1, wherein said row of functional blocks is a flip-flop and said flip-flop is a set-reset scan flip-flop.

5. The semiconductor device according to claim 1, wherein at least one common signal is applied to said row of functional blocks.

* * * * *